United States Patent [19]

Luecke

[11] Patent Number: 5,319,668

[45] Date of Patent: Jun. 7, 1994

[54] TUNING SYSTEM FOR EXTERNAL CAVITY DIODE LASER

[75] Inventor: Francis S. Luecke, San Jose, Calif.

[73] Assignee: New Focus, Inc., Sunnyvale, Calif.

[21] Appl. No.: 954,398

[22] Filed: Sep. 30, 1992

[51] Int. Cl.[5] ................................................ H01S 3/10
[52] U.S. Cl. ..................................... 372/107; 372/15; 372/20
[58] Field of Search ...................... 372/15, 20, 23, 102, 372/107

[56] References Cited

U.S. PATENT DOCUMENTS

| | | | |
|---|---|---|---|
| 4,896,325 | 1/1990 | Coldren | 372/20 |
| 4,937,448 | 6/1990 | Mantz et al. | 250/343 |
| 4,943,971 | 7/1990 | Fiet et al. | 372/46 |
| 4,990,780 | 2/1991 | Lee et al. | 250/343 |
| 5,022,038 | 6/1991 | Bradley | 372/50 |
| 5,028,563 | 7/1991 | Fiet et al. | 437/129 |
| 5,058,124 | 10/1991 | Cameron et al. | 372/107 |
| 5,103,453 | 4/1992 | Kebabian et al. | 372/20 |
| 5,119,338 | 6/1992 | Fiet et al. | 372/46 |

OTHER PUBLICATIONS

"Spectrally Narrow Pulse Dye Laser Without Beam Expander" by Michael G. Littman and Harold J. Metcalf, Applied Optics, vol. 17, No. 14 pp. 224-227, Jul. 15, 1975.

"Novel Geometry for Single-Mode Scanning of Tunable Lasers" by Michael G. Littman and Karen Liu, Optics Letters, vol. 6, No. 3, pp. 117, 118, Mar. 1981.

"Introduction to Optical Electronics" by Amnon Yariu, 1976, published by Holt, Rineart and Wilson no month available.

"Optics" by Eugene Hecht, 1987, published by Addison-Wesley Publishing Company no month available.

"Synchronous Cavity Mode and Feedback Wavelength Scanning in Dye Laser Oscillators with Gratings", by Harold J. Metcalf and Patrick McNicholl, Applied Optics, vol. 245, No. 17, pp. 2757-2761, Sep. 1, 1985.

"External-Cavity Diode Laser Using a Grazing-Incidence Diffraction Grating", by K. C. Harvey and C. J. Myatt, Optics Letters, vol. 16 No. 12, pp. 910-912, Jun. 15, 1991.

Primary Examiner—Rodney B. Bovernick
Assistant Examiner—Robert McNutt
Attorney, Agent, or Firm—Hugh D. Jaeger

[57] ABSTRACT

A tunable external cavity semiconductor laser is provided with a semiconductor laser diode, a diffraction grating and a movable mirror. The diode laser is positioned to illuminate a diffraction grating and a movable mirror is positioned to reflect a selected wavelength back into the cavity. The mirror is mounted on a pivot so positioned to provide simultaneous rotation and linear translation. The pivot point is selected so as to provide an internal cavity length which is exactly an integral number of half wavelengths at three different wavelengths and an exceptionally close (within 1/1000 of one wavelength) match at all other wavelengths within the tuning range. Significantly, the pivot point calculation takes into account the effect of the dispersion of the laser and other optical elements in the system on the cavity length. These elements are usually a small part of the physical length of the cavity, but their greater dispersion makes their contribution to the number of half wavelengths in the resonant cavity very significant.

18 Claims, 15 Drawing Sheets

TUNING SYSTEM FOR EXTERNAL CAVITY DIODE LASER

BACKGROUND OF THE INVENTION

1. Field of the Invention This invention relates generally to tunable diode lasers, and particularly, to an improved tuning system which avoids tuning discontinuities by maintaining a constant integral number of half wavelengths in the tuning cavity over the entire tuning range.

2. Description of the Prior Art Tunable semiconductor diode lasers, which provide an extremely useful optical tool, are handicapped by the fact that the tuning mechanisms do not maintain a constant number of half wavelengths within the cavity. The typical tunable diode laser has one facet having an antireflection coating through which a selected wavelength is fed back into the laser to sustain oscillation at the selected wavelength. Quite commonly, the desired wavelength is selected by means of a diffraction grating with a rotatable mirror which selects a desired wavelength from the beam diffracted by the grating. The variation in angle of the mirror is effective to select the desired wavelength, which is diffracted by the grating at the angle represented by the mirror position. While this approach provides a convenient means for tuning the operating wavelength of the laser, it has been found that mirror rotation alone does not provide a smooth tuning action. This is because the simple rotation of the mirror to select the energy emitted from the diffraction grating at the angle of the desired wavelength does not maintain the length of the tuning cavity at an integral number of half wavelengths. As the wavelength is varied and the number of waves in the cavity varies, the laser output exhibits discontinuities such as large changes in output power.

The basic principles of the operation of the tunable laser utilizing a variable length external cavity in conjunction with a diffraction grating and a rotatable mirror are set forth in the publication, "Spectrally Narrow Pulse Dye Laser Without Beam Expander", by Michael G. Littman and Harold J. Metcalf, *Applied Optics*, vol. 17, No. 14, pages 2224–2227, Jul. 15, 1978 Although the article describes a system which uses a dye laser, the diode laser is easily substituted. The system utilizes a diffraction grating which is filled with an incident collimated laser beam by using the grating at a grazing angle. The diffracted beam at the angle normal to the mirror is reflected back onto the grating and from there, back into the lasing cavity, where it serves to determine the operating wavelength of the system. Rotation of the mirror to select the wave diffracted allows the system to be tuned to a desired output wavelength.

It was later recognized that simple rotation of the mirror did not provide a continuous single mode scan over a range of wavelengths. The publication, "Novel Geometry for Single-Mode Scanning of Tunable Lasers" by Michael G. Littman and Karen Liu, *Optics Letters*, Vol. 6, No. 3, pages 117, 118, March, 1981 describes a tunable cavity in which the mirror is translated axially, as well as rotated, to change the cavity length as well as the angle of the diffracted beam returned to the laser. Although the authors state that the pivot point selected by their method provides exact tracking for all accessible wavelengths, this is, in fact, true only for the case where there are no dispersive elements on the cavity since the changes in optical length due to the effects of dispersion are not considered. Further information of a general nature is available in "Introduction to Optical Electronics" by Amnon Yariu, 1976, published by Holt, Rinehart and Wilson; and "Optics" by Eugene Hecht, 1987, published by Addison-Wesley Publishing Co.

The shortcomings of tuning systems in which the mirror was rotated only was further developed in the publication "Synchronous Cavity Mode and Feedback Wavelength Scanning in Dye Laser Oscillators with Gratings" by Harold J. Metcalf and Patrick McNicholl, *Applied Optics*, Vol. 245, No. 17, pages 2757–2761, Sept. 1, 1985. The geometry described in this publication relates to positioning the point of rotation (pivot point) of the mirror at the intersection of the planes of the surface elements. The article suggests that for oscillators with mirrors as both end elements a possibly useful displaced configuration will also be synchronous. However, the displaced configurations will, as above, be synchronous only in the absence of dispersive elements in the cavity.

A further development, set forth in "External-Cavity Diode Laser Using a Grazing-Incidence Diffraction Grating", by K. C. Harvey and C. J. Myatt, *Optics Letters*, Vol. 16, No. 12, pages 910–912, Jun. 15, 1991, describes a tunable cavity system utilizing a diode laser in which the diode laser has a highly reflective rear facet and an anti-reflection coated output facet with an output window. The output beam is collimated by a lens and illuminates a diffraction grating at a grazing angle. The first order of diffraction of the grating is incident on the mirror, which reflects it back onto the grating, where the first order of diffraction passes back into the diode laser. The output of the system is the zeroth-order reflection from the grating. In this system, no mention is made of coordinated rotation and lineal translation of the mirror.

Various mechanical arrangements for movement of the mirror have been devised to introduce simultaneous rotation and longitudinal translation in attempts to maintain the physical length of the internal cavity at a constant number of half wavelengths. One such a system is shown in U.S. Pat. No. 5,058,124 to Cameron et al.

Despite efforts to devise suitable mechanical arrangements for simultaneous rotation and linear translation of the mirror, the prior art systems either require complex adjustment or do not effectively provide the required constant number of half wavelengths within the tuning cavity. In the case of a cavity containing dispersive elements, even the dispersion caused by air can be a significant factor.

SUMMARY OF THE INVENTION

According to this invention, a semiconductor laser diode is positioned to illuminate a diffraction grating and a movable mirror is positioned to reflect a selected wavelength back into the laser cavity. The mirror is mounted on a pivot so positioned to provide simultaneous rotation and linear translation. The pivot point is selected so as to provide an internal cavity length which is exactly an integral number of half wavelengths at three different wavelengths and an exceptionally close (within 1/1000 of one wavelength) match at all other wavelengths within the tuning range. Significantly, the pivot point calculation takes into account the effect of the dispersion of the laser and other optical elements in the system on the cavity length. These elements are usually a small part of the physical length of the cavity, but their greater dispersion makes their contribution to number of half wavelengths in the resonant cavity very significant.

BRIEF DESCRIPTION OF THE DRAWINGS

Other Objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

Figure 1:
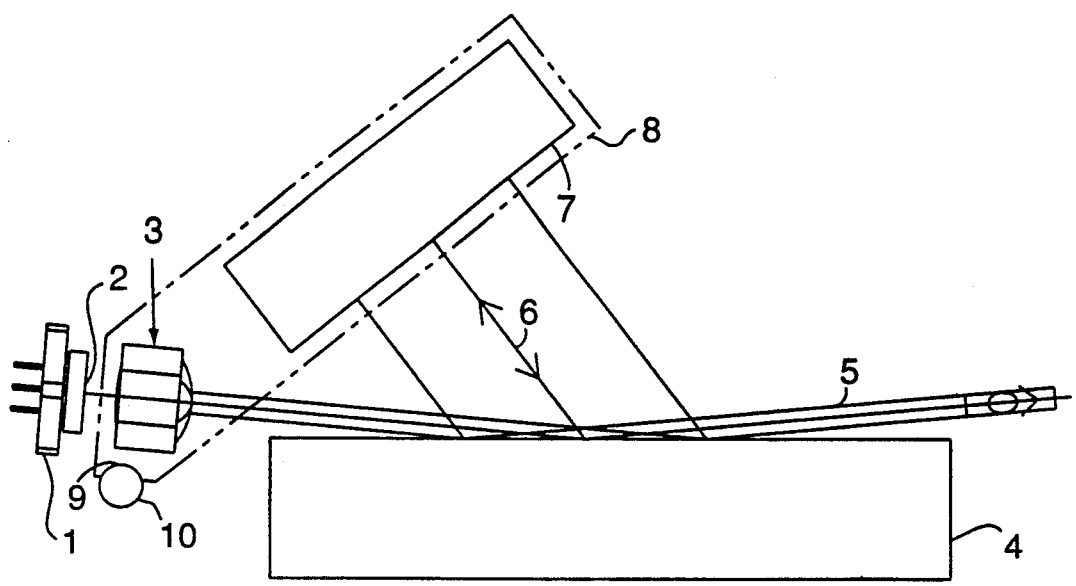
FIG. 1 is a schematic representation of the layout of the principal components of the system.

With reference to FIG. 1, a solid state diode laser 1 emits a beam with a nominal wavelength of 660 to 680 nanometers which passes through collimating lens 3 and illuminates grating 4 at a grazing angle. The zeroth-order reflection 5 from grating 4 is the output beam from the system. The first-order diffraction 6 from the grating 4 hits mirror 7 and is reflected back on to grating 4, from which it is returned to the laser 1 by a second diffraction. Mirror 7 is supported by mirror support arm 8, shown schematically by the broken line. Mirror support arm 8 has a socket 9 adapted to rotate on ball element 10, thereby allowing rotational movement of arm 8 and mirror 7. This showing is schematic only and is not intended to constitute an accurate geometric portrayal of the locations of the elements shown.

Although the selection of the various elements of the system will be dependent on the particular use for which the system is intended, one embodiment utilizes a type TOLD9215 diode laser sold by Toshiba. This laser has a physical length in the range of 200-300 microns and includes a window of 250-275 microns thickness. The lens 3 is a molded glass aspheric lens no. 350110 from Corning Glass selected to be 4.5 mm in thickness. Diffraction grating 4 may be of the holographic type having 2400 lines per mm, such as that sold by Edmund Scientific as number 43226.

Figure 2:
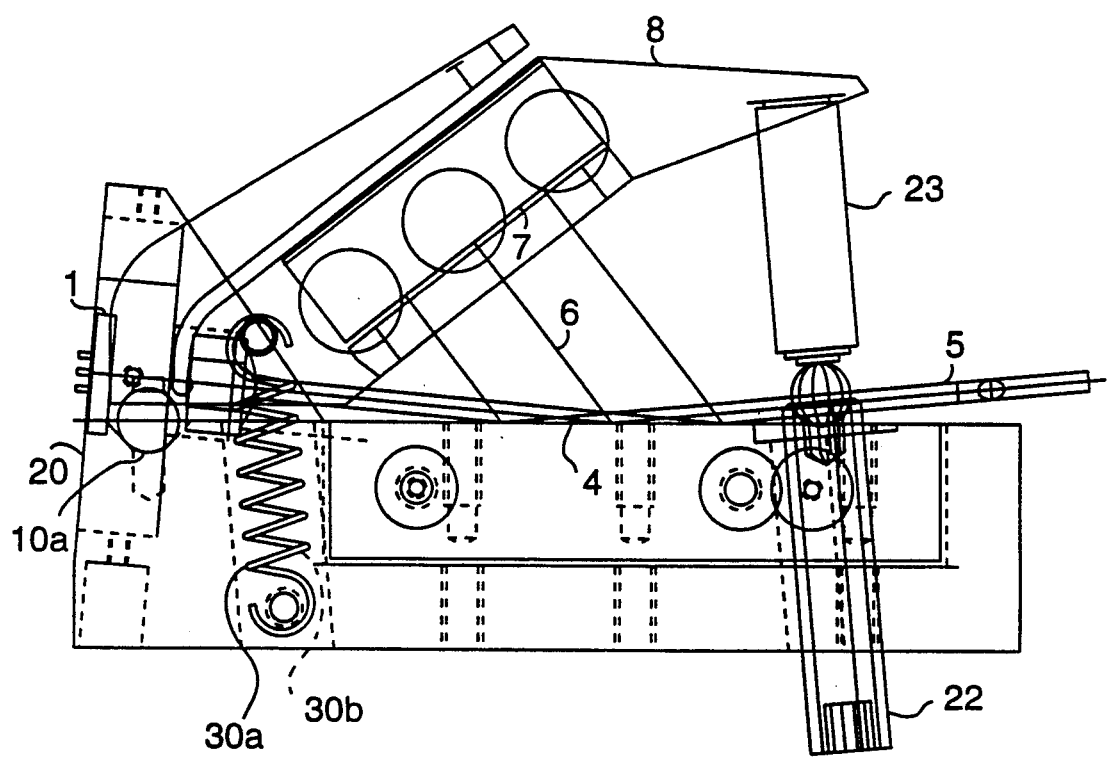
FIG. 2 is a side view, partially in section, showing a preferred embodiment of the invention.

FIG. 2 is a side view of a preferred embodiment of the invention. Laser 1 is mounted on a base element 20 which also supports diffraction grating 4. Mirror support arm 8 is supported for rotational movement by a pair of pivot ball elements $10a$ and $10b$, the latter of which is not shown. Pivot ball elements $10a$ and $10b$ are supported by matching socket portions in base 20 and mirror support arm 8 to permit rotational movement of mirror support arm 8 about an axis of rotation defined by the line connecting the centers of balls $10a$ and $10b$. This method of supporting mirror support arm 8 provides for a low friction, high precision rotational mount. The angular and lineal position of mirror support arm 8 is adjusted by means of tuning screw 22 and piezoelectric actuator 23. Clockwise rotation of tuning screw 22 causes rotational movement of mirror support arm 8 in the counterclockwise direction about the center of pivot balls $10a$ and $10b$. The application of a signal voltage to piezoelectric actuator 23 causes the actuator to extend or contract in length to provide a vernier and a high frequency, electrical adjustment of the position of mirror support arm 8. Voltage can also be applied to piezoelectric actuator 23 in a repetitive waveform to provide a scanning function.

Rotational movement of mirror support arm 8 in the counterclockwise direction causes the angle of the reflected wave from grating 4 to be increased and the length of the cavity, from the rear of laser 1 to the mirror 7, to increase, thereby selecting a longer wavelength for operation of the system. Conversely, clockwise rotation of mirror support arm 8 causes the output wavelength of the system to decrease.

The operational wavelength of the system may be considered to be primarily determined by the angle of mirror 7 with respect to grating 4. The change in the cavity length caused by lineal translation of the mirror is primarily for the purpose of maintaining an integral number of half-wavelengths in the resonant cavity. Spring elements $30a$-$30b$ bias the mirror support arm 8 against the balls $10a$ and $10b$.

Figure 3:
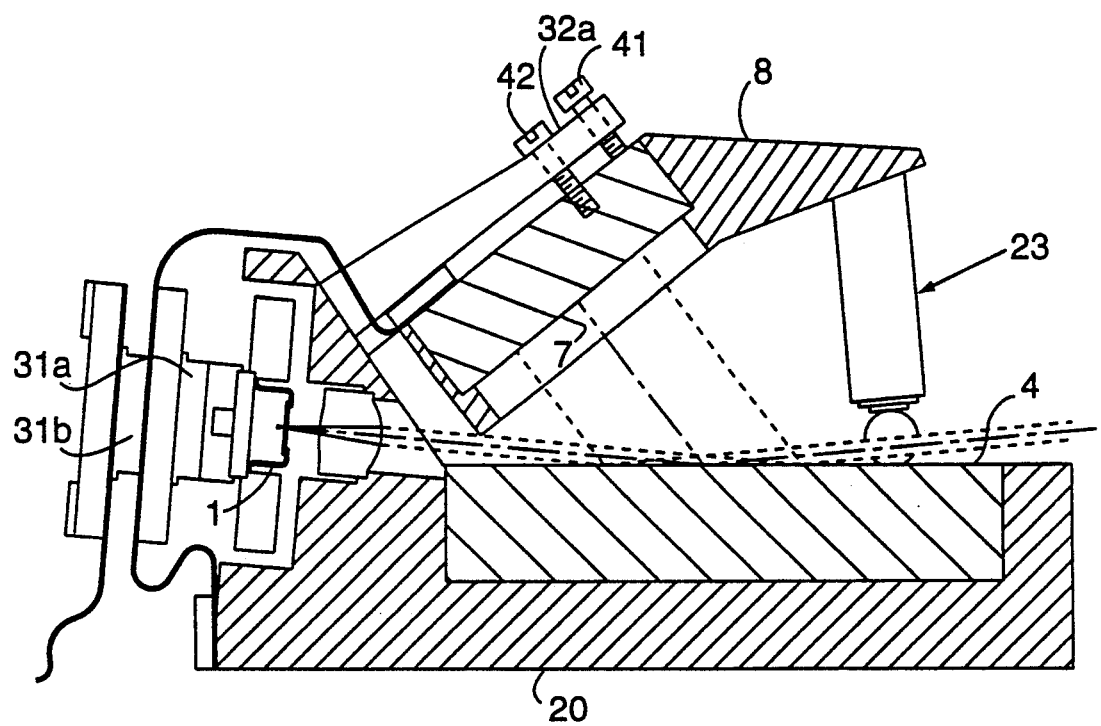
FIG. 3 is a sectional side view of the preferred embodiment of the invention.

FIG. 3 represents a sectional view taken from the side of the device along the center line. Since the system is sensitive to heat generated by laser 1, thermo electric coolers $31a$ and $31b$ are provided to conduct heat generated by laser 1 from the system. Alignment lever portions 32a and 32b (shown in FIG. 4) of mirror support arm 8 are provided to provide means for making the initial alignment of mirror 7 on the mirror support arm 8. Once the adjustment of mirror 7 has been made, no further adjustment of mirror position is required and the mirror is moved only with the tuning screw 22 and piezoelectric actuator 23.

Figure 4A:
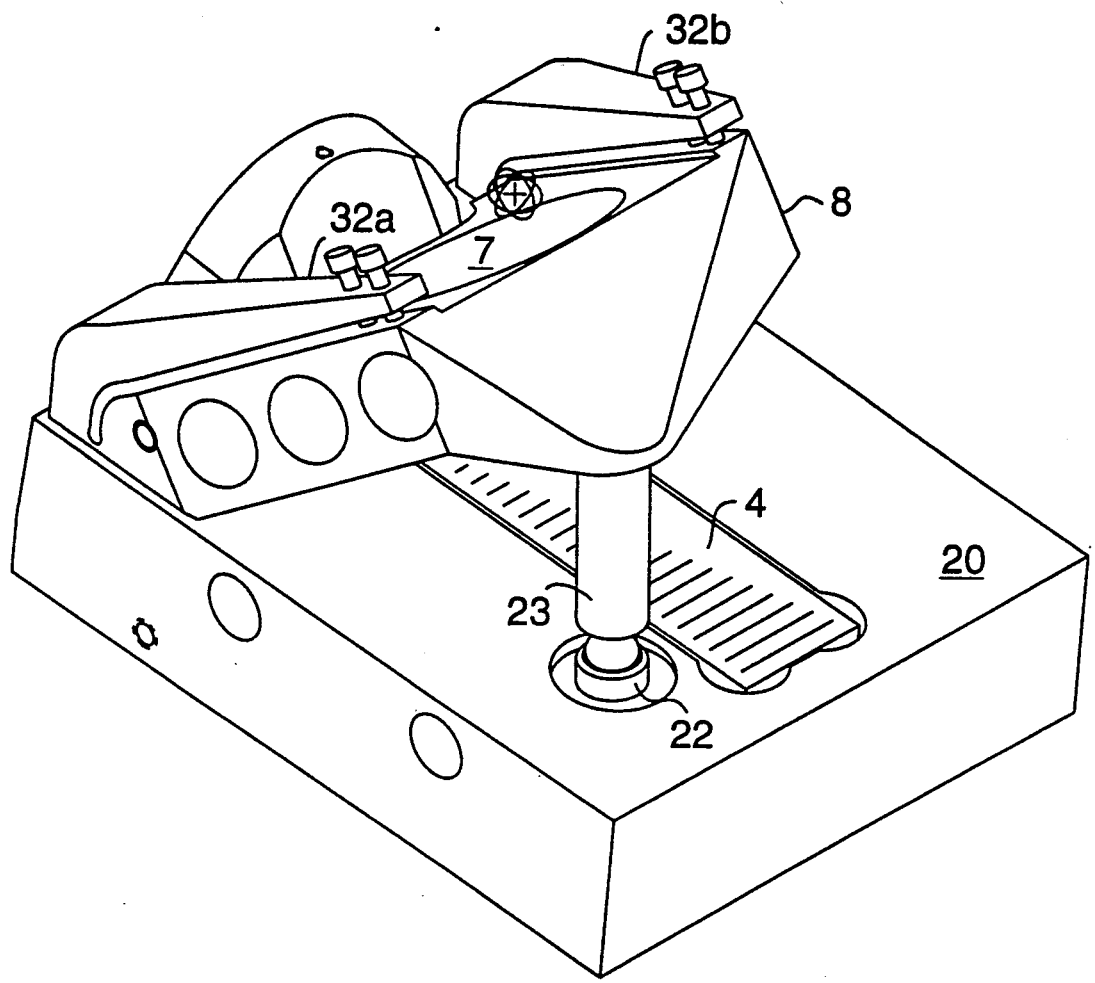
FIG. 4A is an isometric view of a preferred embodiment of the invention.

The isometric view of FIG. 4A shows the entire system of the preferred embodiment. Diffraction gating 4 is centrally positioned on the upper surface of base 20. The position of tuning screw 22 and piezoelectric actuator 23 is offset from the centerline of the system to provide clearance for the output beam incident on grating 4. Piezoelectric actuator 23 therefore engages mirror support arm 8 at a point offset from the center.

Figure 4B:
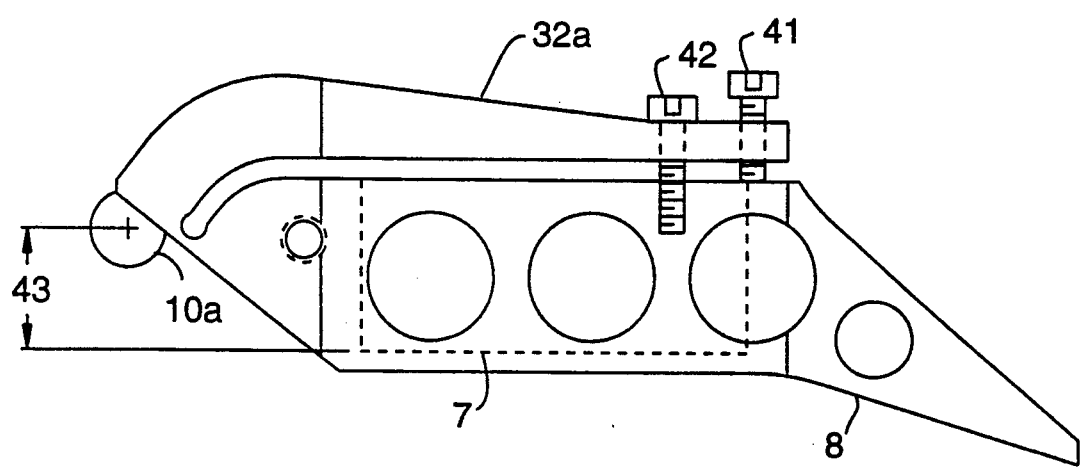
FIG. 4B is a side view of a mirror support arm illustrating the means for adjusting the plane of the mirror relative to the pivot point.

With reference to FIG. 4B, a side view of mirror support arm 8 and alignment lever 32a, a pair of fine threaded adjustment screws 41 and 42 provide means for adjusting the distance 43 to properly position the mirror with respect to the center of pivot ball 10a. The 0-80 adjustment screw 41 passes through a threaded hole in alignment lever 32a and bears against the upper surface of mirror support arm 8. The 0-80 adjustment screw 42 passes through a clearance hole in alignment lever 32a into a threaded hole in mirror support arm 8. Turning screw 41 clockwise causes distance 43 to increase. Conversely, turning screw 42 clockwise causes distance 43 to decrease. Since adjustment screws are provided on both sides of mirror support arm 8, optimal alignment of mirror 7 may be achieved without the need for exacting tolerances on the initial position of mirror 7.

Figure 5:
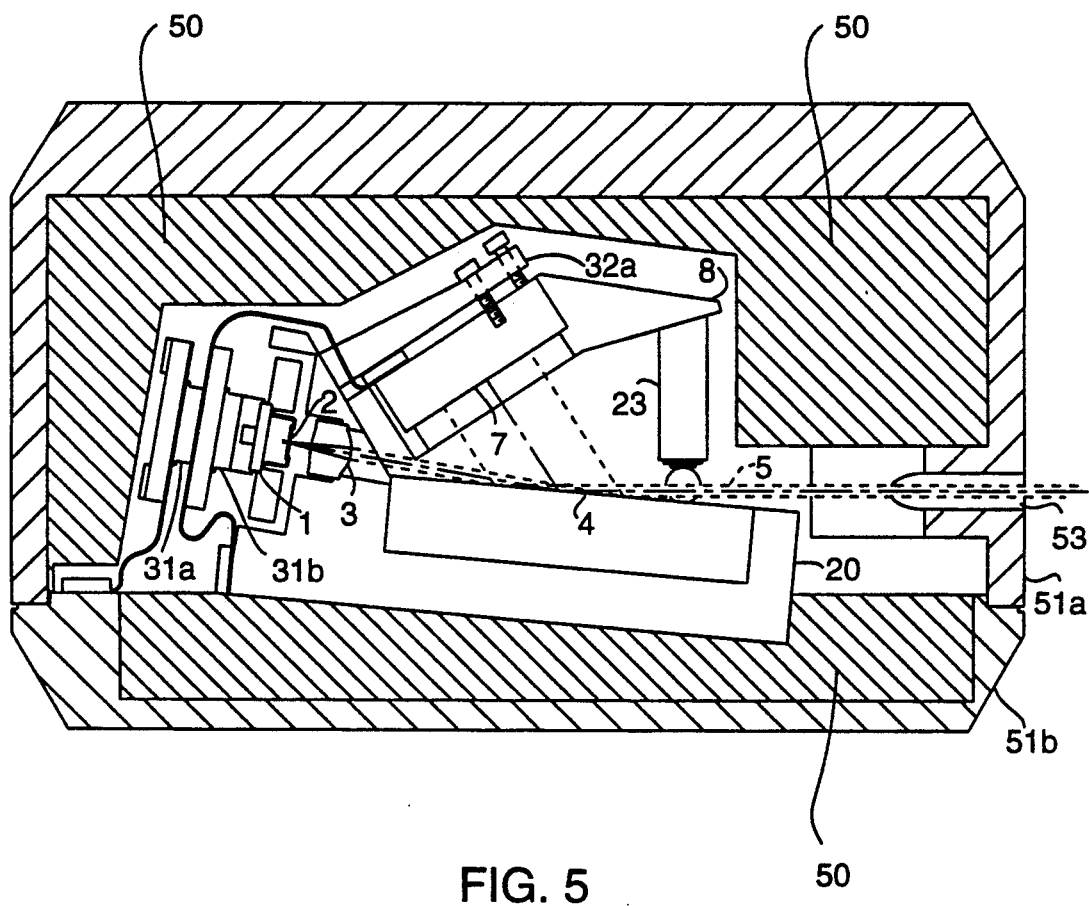
FIG. 5 is a sectional side view of the preferred embodiment of the invention enclosed in an insulating housing.

Since laser devices of this type are sensitive to temperature changes, the preferred embodiment, as shown in FIG. 5, incorporates a shroud 50 of insulating material and a protective case 51a and 51b of suitable material such as aluminum or high tensile plastic such as fiber-reinforced polycarbonate. To provide occasional access to the device, the case may include a removable cover 51a which fits over the base portion 51b. The base element 20 of the laser system will be affixed to the insulating material within base portion 51b of the case. An aperture 53 is provided in cover 51a for output beam 5.

A transparent window is placed over the aperture 53, a gasket is placed between the base portion 51b and cover 51a, and all other openings in the case are sealed to prevent changes in air pressure and temperature from affecting the optical path length.

Figure 6:
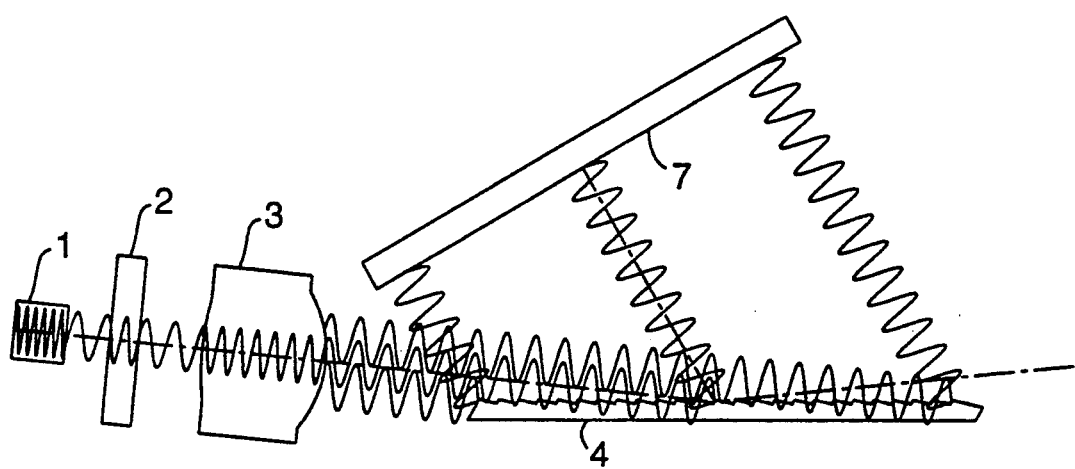
FIG. 6 is a schematic showing, not to scale, of the fashion in which the index of refraction of the laser, laser window and the collimating lens affect the optical length of the cavity.

The angular position of mirror 7 determines the particular angle of the first-order diffraction from the grating 4 which will be reflected back into laser 1. If the distance of mirror 7 is calculated according to simply the physical distance from the back mirror facet of laser 1, an error will exist because of the contribution of the various elements having different indices of refraction. This is illustrated schematically in FIG. 6. The material of laser 1 has a relatively high index of refraction. Similarly, window 2 and lens 3 also have high indices when compared to air. Because of the high index of refraction of these elements and the change of the index of refraction as a function of wavelength, i.e. dispersion, their contribution to the optical distance must be considered when calculating the lineal position of mirror 7.

To properly provide for maintenance of the same integral number of half-wavelengths in the tunable cavity over the tuning range, the physical distance must be corrected for the changes in the index of refraction (i.e., dispersion) of the optical elements and the air within the optical path, as well as the relatively simpler correction for the different wavelengths.

Figure 7A:
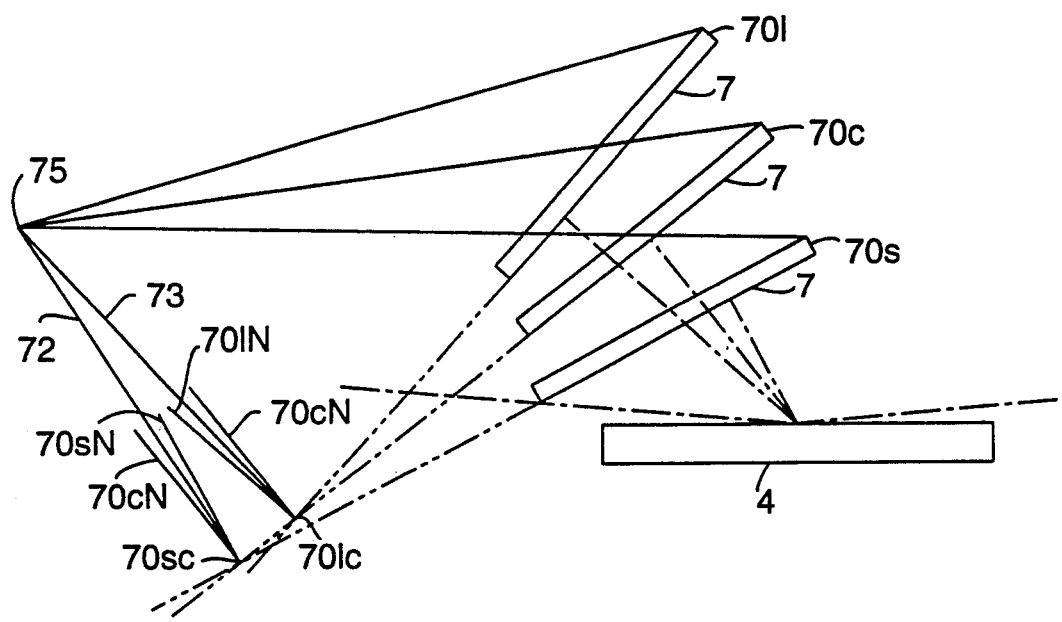
FIG. 7A is a schematic representation, not to scale, showing the laser beam, the diffraction grating, three positions of the mirror and the mirror pivot point to geometrically illustrate the fashion in which the location of the mirror pivot point is determined.

FIG. 7A shows how the appropriate location for the pivot axis is established. The first step in the process is the calculation of the appropriate angle and lineal position for the mirror at various wavelengths of the operating range. This calculation proceeds according to the following:

The subscript indicates the wavelength at which the calculation is made: In this example, i ranges from 0 to 20; corresponding to wavelengths 0.660 to 0.680 microns.

Figure 7B:
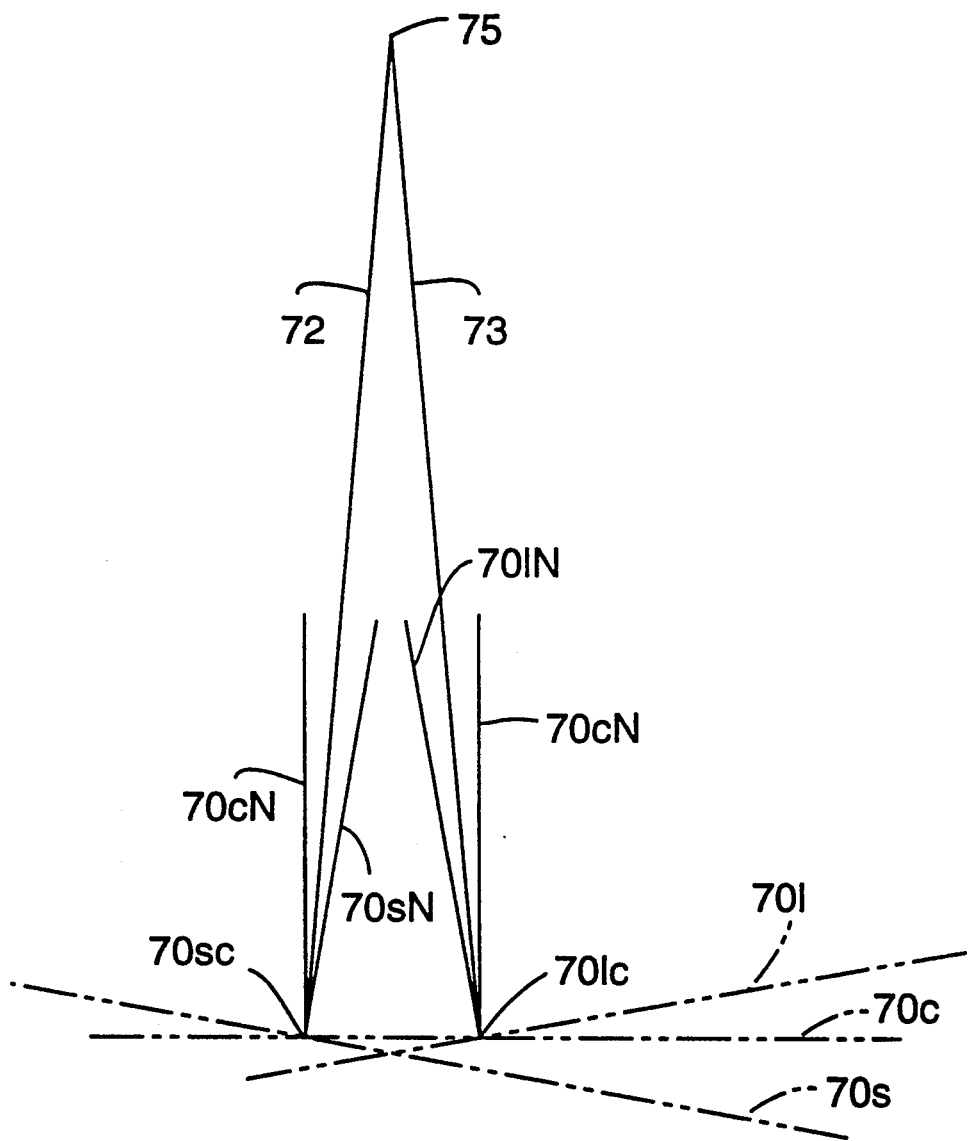
FIG. 7B is an expanded, simplified view of a portion of FIG. 7A illustrating the geometry of the determination of the mirror pivot point.
Figure 7C:
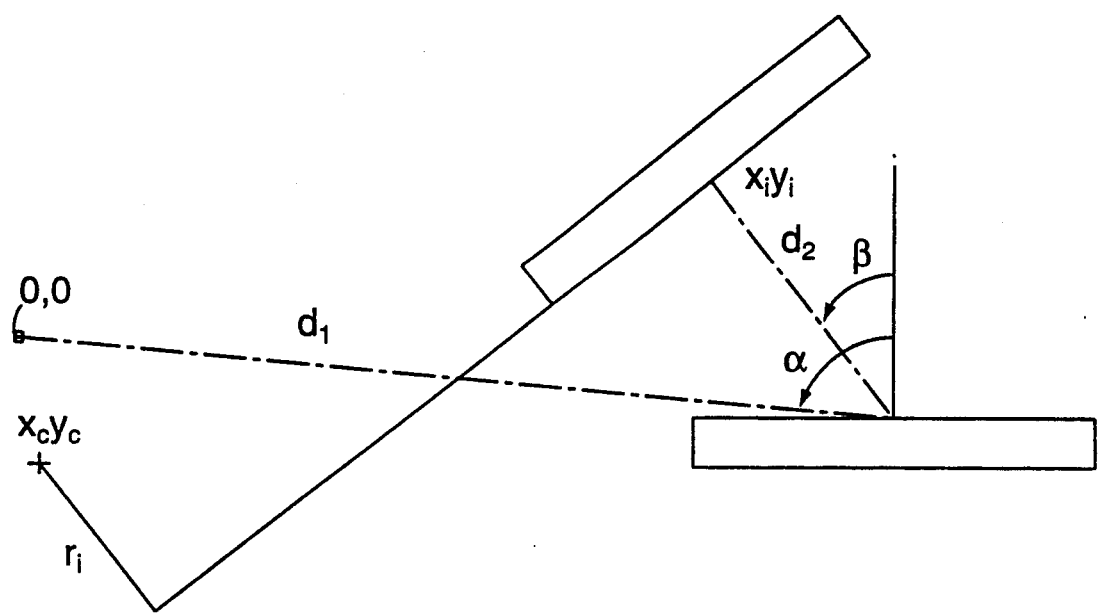
FIG. 7C is a view of the system in FIG. 7A designating variables used in calculating the best pivot point for the system.

Please refer to FIG. 7C.

$$a := \frac{1}{2.4} \quad \text{spacing of lines on grating}$$

$$\alpha := 85 \cdot \text{deg} \quad \text{incident angle of beam}$$

$$N := 86614 \quad \text{no. of waves in cavity - single pass}$$

$$d1 := 36847.25 \quad \text{physical distance between back facet \& grating, along central ray}$$

values chosen for convenient layout $$\beta_i := a\sin\left(\frac{\lambda_i}{d} - \sin(\alpha)\right) \quad \text{angle of diffracted beam}$$

$$d2_i := N \cdot \lambda_i - op1_i - d1 \quad \text{distance from grating to mirror required to accomodate } N \text{ waves in cavity}$$

$$x_i := d1 - d2_i \cdot \cos(\alpha - \beta_i),$$
$$y_i := d2_i \cdot \sin(\alpha - \beta_i)$$

point of incidence of beam upon mirror $$m_i := \tan\left(\frac{\pi}{2} - \alpha + \beta_i\right)$$
$$b_i := y_i - m_i \cdot x_i$$

equation of mirror line (as in $y = mx + b$)

$$xc1 := \frac{b_{10} - b_1}{m_1 - m_{10}}$$

$$yc1 := m_1 \cdot xc1 + b_1$$

point in common for mirror lines at .661 & .670

$$mc1 := \tan\left[\frac{\pi}{2} + .5 \cdot (atan(m_1) + atan(m_{10}))\right]$$

$$bc1 := yc1 - mc1 \cdot xc1$$

equation of line bisecting angle between normals to mirror lines at .661 & .670 at point in common $$xc2 := \frac{b_{19} - b_{10}}{m_{10} - m_{19}}$$

$$yc2 := m_{10} \cdot xc2 + b_{10}$$

point in common for mirror lines at .670 & .679

$$mc2 := \tan\left[\frac{\pi}{2} + .5 \cdot (atan(m_{10}) + atan(m_{19}))\right]$$

$$bc2 := yc2 - mc2 \cdot xc2$$

equation of line bisecting angle between normals to mirror lines at .670 & .679 at point in common $$xc := \frac{bc2 - bc1}{mc1 - mc2}$$

$$yc := mc1 \cdot xc + bc1$$

equation of point in common for bisectors; ie, best pivot point $$xc = 661.39573$$

$$yc = -3.08266 \cdot 10^3$$

best pivot point $$h_i := \frac{-m_i \cdot xc + yc - b_i}{\sqrt{(m_i)^2 + 1}}$$

Perpendicular distance from mirror to pivot. Ideally this would be identical for all wavelengths; variation indicates quality of choice of pivot.

In geometric terms, the calculation generates mirror positions for three different wavelengths. Typically, the three wavelengths represent the center wavelength of the tuning range and wavelengths on either side of the center wavelength slightly inside the limits of the tuning range. In this showing of FIG. 7A, the mirror position for the center wavelength is shown at 70c, the mirror position for the longer wavelength is shown at 70l and the mirror position for the shorter wavelength is shown at 70s. The plane in which each mirror lies is extended to the line where it intersects with another plane. In FIG. 7A, the planes for mirror positions 70s and 70c intersect at point 70sc and the planes for mirror positions 70l and 70c intersect at point 70lc. Normals 70sN and 70cN to the plane of mirror 70 and 70s are erected at the point 70sc and the bisector of the angle formed by the normals is extended along line 72.

A similar exercise is performed for the intersection 70lc of mirror planes for mirrors 70l and 70c. Normals 70lN and 70cN to the plane of mirrors 70l and 70c are erected at the point 70lc and the bisector of the angle formed by the normals is extended along line 73. The bisectors 72 and 73 intersect at point 75, which is the optimal location of the pivot point to provide the minimum distance error in the optical length of the tuning cavity. This is, to provide the same integral number of half-wavelengths in the tuning cavity over the entire operating range of the tuning system.

FIG. 7B represents a portion of FIG. 7A redrawn to a larger scale with all reference characters in FIG. 7B representing the same element as in FIG. 7A.

Figure 8A:
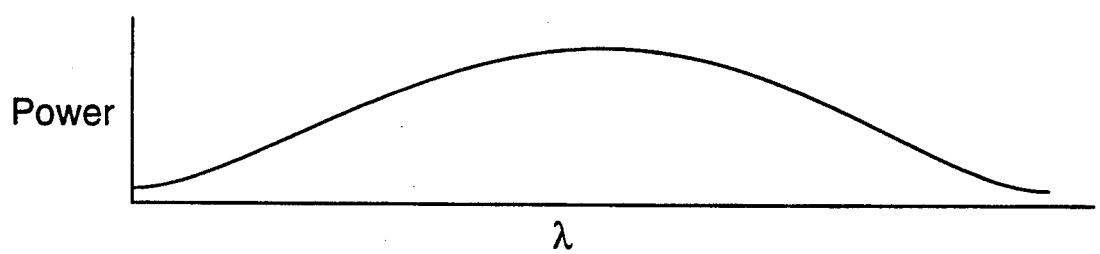
FIG. 8A is a schematic showing of the relative power output of the laser when the optical path is maintained at an integral number of half wavelengths and tuned over the entire tuning range.

The effect of maintaining a constant integral number of half-wavelengths in the tuning cavity on the output power is shown schematically in FIG. 8A, which represents a plot of output power versus wavelength. While this is a theoretical plot, it is characteristic of systems embodying the present invention. It can be seen that the output power follows a smooth curve which rises toward the center of the operating wavelength and dips toward the higher and lower limits of the operating wavelength.

Figure 8B:
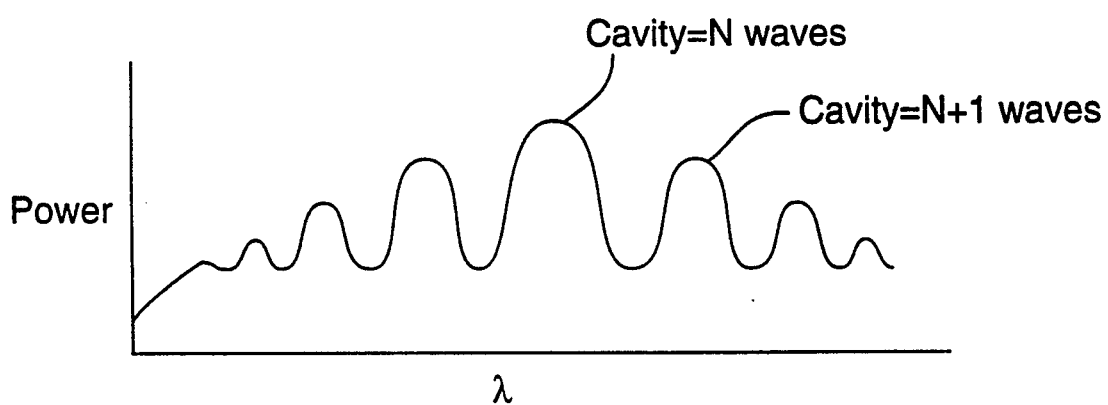
FIG. 8B is a schematic showing of the relative power output of the laser when the optical path is maintained at a length proportional to wavelength, ignoring dispersion, illustrating the power output variations which result as the number of half waves in the path length changes.

The output power to be expected from systems which do not maintain the same integral number of half-wavelengths is shown in FIG. 8B, which represents a plot of output power versus wavelength. It can be seen that the output power follows an airy function with the peaks representing integral numbers of half-wavelengths and the valleys representing the transition between the integral half wavelength points. The actual plot may differ somewhat from the theoretical form, but will never be a smooth curve such as shown in FIG. 8A.

Figure 9:
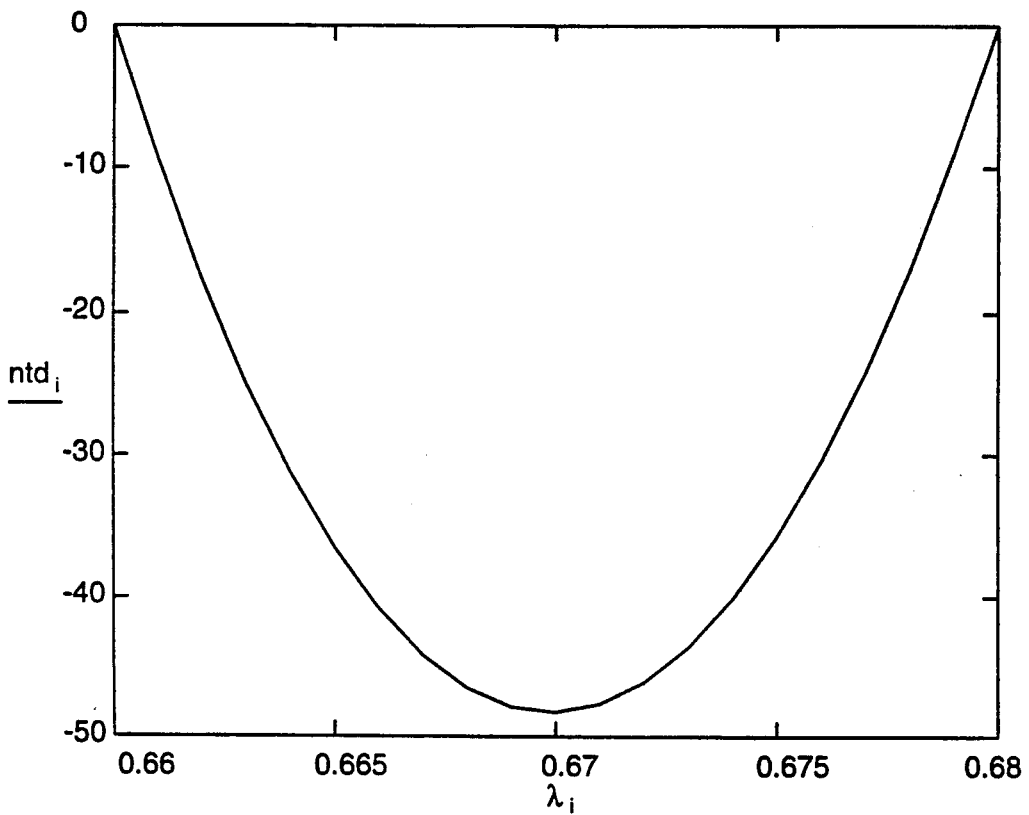
FIG. 9 is plot of the effect of dispersion versus wavelength, and illustrating the non-linearity of this relationship.

To obtain a smooth curve of FIG. 8A, the physical position of the mirror at each of the three points used in the calculation previously described must take into account the effect of the index value of each of the optical elements at the three wavelengths. The complexity of the compensation problem is demonstrated in FIG. 9, which represents a plot of the effect of dispersion versus wavelength.

Figure 10:
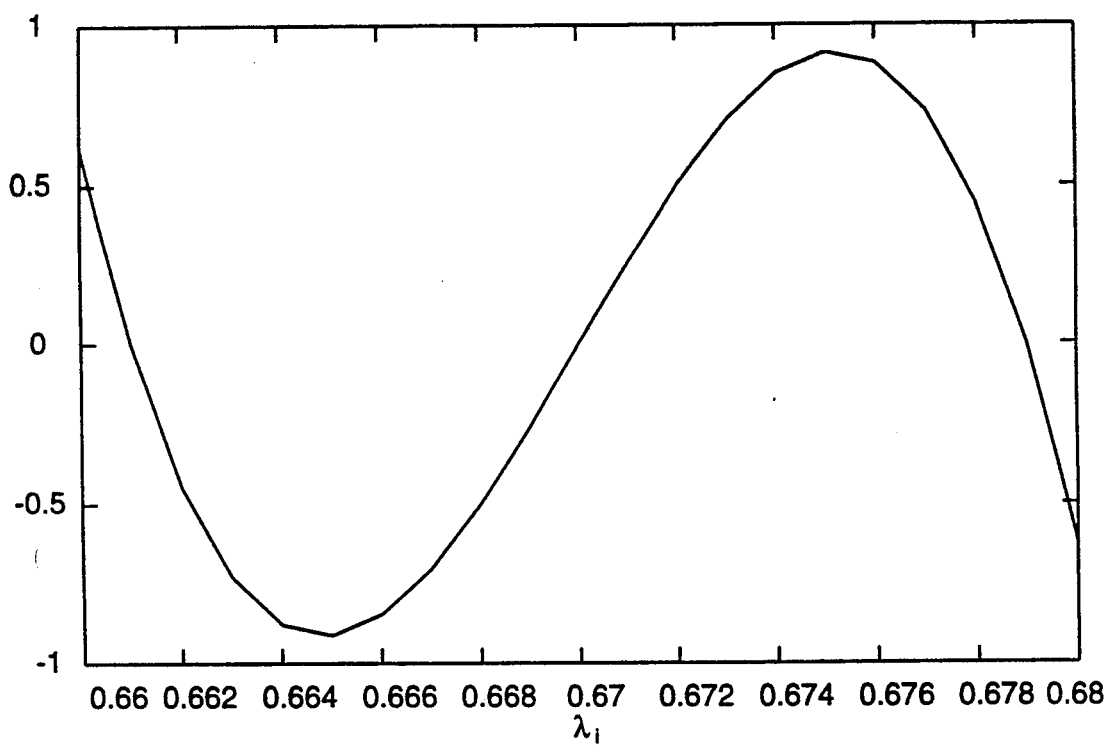
FIG. 10 is a plot of the residual error in mirror position, in nanometers, for a mirror positioned in accordance with the invention; and, FIG. 11 is a comparative plot of the residual error for systems using the invention and systems without the invention.

The effectiveness of the invention is demonstrated in FIG. 10 which shows a plot of mirror position error versus wavelength. It can be seen that the system provides zero error at the three selected wavelengths and varies no more than 1/1000 of a wavelength over the operating range of the system.

Figure 11:
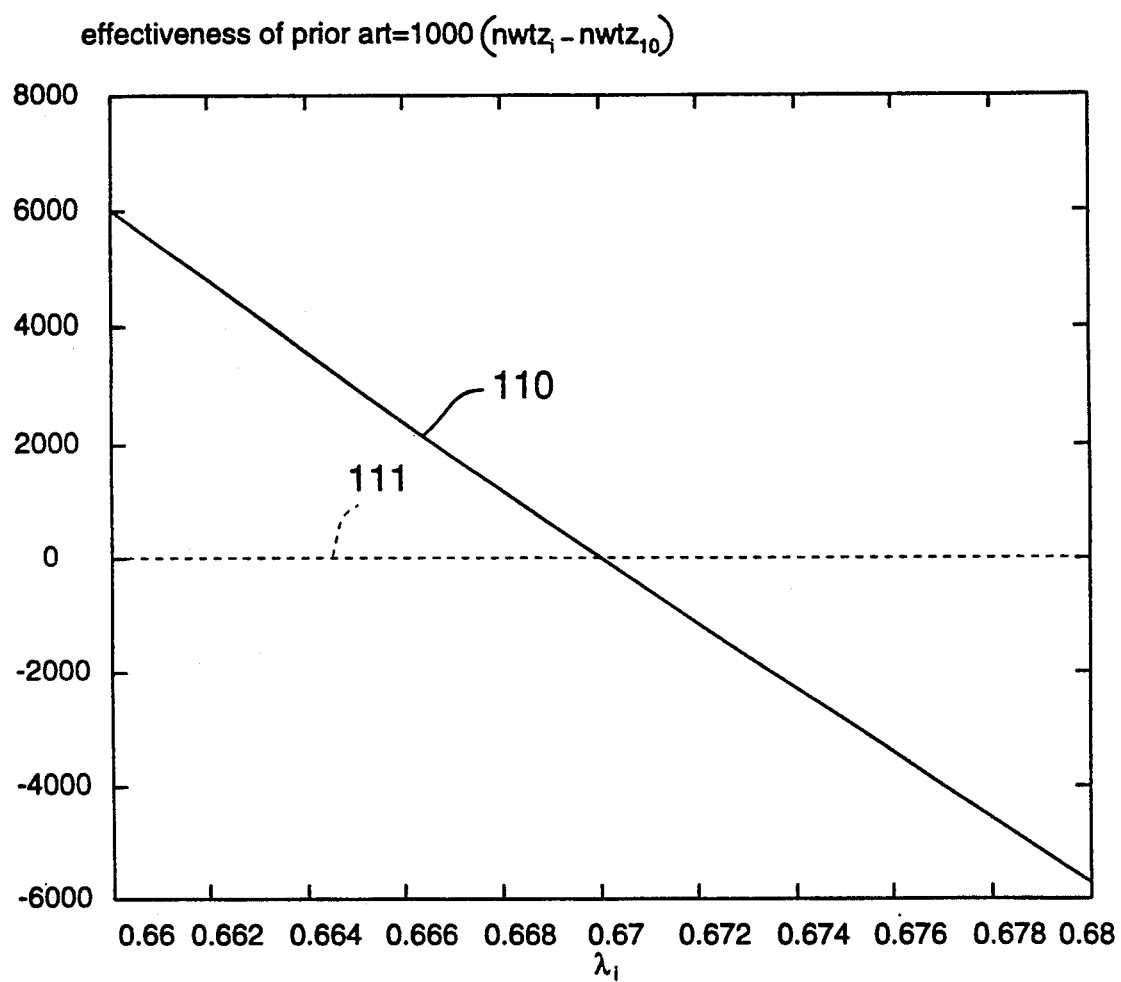

FIG. 11 illustrates the residual error for a system which does not compensate for dispersion, curve 110, and a system which incorporates the invention, curve 111. The vertical scale is the error in thousandths of a wavelength.

Although the foregoing description of the invention and the preferred embodiment is presented in terms of a specific arrangement of laser, grating and mirror often called littman, it will be appreciated that the invention is applicable to the implementation of other external cavities as well, for example, the Littman configuration, in which the diffracted beam is directed straight back toward the laser.

Various modifications can be made to the present invention without departing from the apparent scope hereof.

I claim:

1. In a tunable diode laser having an external cavity including a collimating lens, a rotatable mirror for reflecting a selected wavelength from a diffraction grating back into the laser, means for simultaneous rotation and linear translation of said mirror comprising:
   a. a pivot axis, for rotation of said mirror, positioned at the intersection of the bisectors of the angles created by the normals to the mirror planes at the points of intersection between said minor for first, second and third positions of said mirror;
   b. the first said position representing the angular position which reflects a first desired wavelength, diffracted by said diffraction grating, in the tuning rang of said system, and a first lineal position corresponding to an optical distance for said lasers and cavity representing a first integral number of half wavelengths at said first desired wavelength;
   c. the second said position representing the angular position which reflects a second desired wavelength, the nominal center wavelength of said system, diffracted by said diffraction grating and a second lineal position corresponding to the optical distance for said laser and said cavity representing said first integral number of half wavelengths at said nominal center wavelength of said system;
   d. the third said position representing the angular position which reflects a third desired wavelength, on the opposite side of said nominal center wavelength form said first desired wavelength and within the tuning range of said system, diffracted by said diffraction grating and a third lineal position corresponding to the optical distance for said laser and cavity representing said first integral number of half wavelengths at said third wavelength; and,
   e. said first, second and third lineal positions including distance corrections to the actual physical length corresponding to the length and indices of refraction of the window of said diode laser and a distance correction corresponding to the thickness and indices of refraction of the lens.

2. A system according to claim 1 wherein said distance corrections for said first, second and third lineal positions further include distance corrections for additional optical elements in said tuning cavity corresponding to the lengths and indices of refraction of said additional elements including the air in said optical cavity.

3. A system according to claim 1 wherein said distance corrections to said first, second and third lineal positions is calculated according to the formula:

$$opl_i = [td(nd_i-1)] + [tw(nw_i-1)] + [tl(nl_i-1)]$$

where:

$opl_i$ = the correction to the physical length
$td$ = the length of the semiconductor diode
$nd_i$ = the index of refraction of the semiconductor diode material
$tw$ = the thickness of the window of the semiconductor diode
$nw_i$ = the index of refraction of the window material
$tl$ = the thickness of the lens
$nl_i$ = the index of refraction of the lens material.

4. A system according to claim 1 further including:
   a. a base element supporting said diffraction grating; and,
   b. first and second spaced spherical elements having their centers positioned at spaced points on said pivot axis and lying between said rotatable mirror and said base element to provide a bearing therebetween permitting rotational movement of said mirror and said diffraction grating about said pivot axis.

5. A system according to claim 4 further including:
   a. a first pair of bearing retention sockets in said base member;
   b. mirror mounting means for support of said rotatable mirror;
   c. a second pair of bearing retention sockets in said mirror mounting means; and,
   d. first and second pairs of sockets coacting to retain said first and second spherical elements in a position where their centers lie on said pivot axis.

6. The system according to claim 5 further including first and second spring means having their ends affixed to said base member and said mirror mount to bias said base member and said mirror mount toward each other and hold said spherical elements within said retention sockets.

7. A system according to claim 6 wherein said spring means are coil springs.

8. A system according to claim 7 wherein the coil springs are oriented to permit rotational movement of said mirror.

9. A system according to claim 8 wherein said spherical elements are spaced apart on said pivot axis to inhibit axial misalignment of said mirror.

10. In an external cavity tunable laser system having a laser, having a laser, a diffraction grating and a rotatable mirror positionable to reflect a beam diffracted by said diffraction grating at a selected angle, corresponding to the diffraction angle of a selected wavelength, back into said laser, the improvement comprising:
   a. pivot means for said mirror;
   b. the axis of rotation of said pivot means positioned at the line of intersection of the bisectors of the angles created by the normals to the plane of said mirror at three different angular positions of said mirror representing the diffraction angle from said grating of three different wavelengths;
   c. said normals passing through their corresponding mirror planes at the points of intersection between said mirror planes at said three different angular positions;
   d. said three different angular positions of said mirror corresponding to the angular position which reflects three different wavelengths within the tuning range of said laser and a lineal position representing an integral number of half wavelengths within said cavity at said three different wavelengths; and,
   e. one of said three different wavelengths is the nominal center wavelength of the system.

11. A system according to claim 10 wherein said three different wavelengths are spaced approximately equal number of wavelengths from each other.

12. The system according to claim 10 wherein the other two of said three different wavelengths are nominally a wavelength near the shortest wavelength of the system and a wavelength near the longest wavelength of the system.

13. A semiconductor diode laser according to claim 10 wherein the second of said three different wavelengths is wavelength closer to the longest wavelength than said nominal center wavelength, and said third wavelength is a wavelength closer to the shortest wavelength than said nominal center wavelength.

14. An external cavity tunable laser system comprising:
 a. a base member;
 b. diffraction grating means mounted on said base member;
 c. diode laser means mounted on said base member and having an output beam positioned to strike said grating at a grazing angle;
 d. mirror means for reflecting a diffracted beam from said grating back onto said grating and thence back into said laser;
 e. mirror mounting means providing for simultaneous lineal and rotational movement of said mirror about an axis of rotation corresponding to the line of intersection of the bisectors of the angles created by the normals to the plane of said mirror at three different positions of said mirror, said normals passing through their corresponding mirror planes at the points of intersection between said mirror planes at said three different angular positions, each of said three different angular positions of said mirror providing an integral number of half wavelengths within said cavity at a selected wavelength, calculated according to the general formula:

$$Opl = Phl + C,$$

where:

Opl = the optical length of the tuning cavity
Phl = the physical length of the tuning cavity
C = a correction for the wavelength-dependent indices of refraction of the optical elements of the system.

15. A system according to claim 14 wherein said mounting means for said mirror comprises
 a. first and second pairs of sockets positioned in abutting relationship on said base member and said mounting means respectively; and,
 b. first and second bearing members positioned within said sockets to accommodate rotational movement of said mirror mount relative to said base member.

16. A system according to claim 15 further including spring means affixed to said base member and said mirror mount to bias said mirror mount against said bearing members.

17. The system according to claim 15 wherein said bearing members are a hemispherical shape 18. A system according to claim 15 wherein said mirror mounting means further includes:
 a. a pair of mirror adjustment arms respectively affixed to said mirror mounting means in close proximity to one of said second pair of sockets and extending outwardly therefrom to a point spaced from said mirror mounting means; and,
 b. each of said adjustment arms having a first adjustment screw passing through a clearance hole in said adjustment arm into a tapped hole in said mirror mounting means a first distance from the point at which said adjustment arm is affixed to said mirror mounting means and a second adjustment screw passing through a tapped hole in said adjustment arm to bear against said mirror mounting means at a point spaced a second, greater, distance from the point at which said adjustment arm is affixed to said mirror mounting means, whereby said first screw is operative to deflect said mirror toward said axis of rotation and said second adjustment screw is operative to deflect said mirror away from said axis of rotation.

* * * * *